United States Patent [19]

Franke et al.

[11] 4,389,480

[45] Jun. 21, 1983

[54] LIGHT-SENSITIVE LAYER TRANSFER MATERIAL

[75] Inventors: Werner Franke, Wiesbaden; Markus Seibel, Mainz, both of Fed. Rep. of Germany

[73] Assignee: Hoechst Aktiengesellschaft, Fed. Rep. of Germany

[21] Appl. No.: 224,230

[22] Filed: Jan. 12, 1981

Related U.S. Application Data

[63] Continuation of Ser. No. 972,817, Dec. 26, 1978, abandoned.

[30] Foreign Application Priority Data

Dec. 29, 1977 [DE] Fed. Rep. of Germany ....... 2758575

[51] Int. Cl.³ ............................................... G03C 5/04
[52] U.S. Cl. .................... 430/271; 340/256; 430/262; 430/263; 430/260; 430/259; 430/501
[58] Field of Search ............... 430/501, 259, 260, 271, 430/262, 263, 256; 972/817

[56] References Cited

U.S. PATENT DOCUMENTS

| | | | |
|---|---|---|---|
| 3,359,107 | 12/1967 | Goffe et al. | 430/263 |
| 3,469,982 | 9/1969 | Celesta | 430/260 |
| 3,782,939 | 1/1974 | Bonham | 430/253 |
| 3,884,693 | 5/1975 | Bauer et al. | 430/256 |
| 3,915,709 | 10/1975 | Welch | 96/78 |
| 3,961,961 | 6/1976 | Rich | 430/262 |
| 4,001,023 | 1/1977 | Van Paesschen | 96/87 R |
| 4,060,656 | 11/1977 | Naka et al. | 96/87 R |
| 4,132,552 | 1/1979 | Van Paesschen et al. | 96/87 R |
| 4,157,918 | 6/1979 | Wanat et al. | 96/87 R |
| 4,175,964 | 11/1979 | Uchida et al. | 430/260 |

FOREIGN PATENT DOCUMENTS

| | | |
|---|---|---|
| 2403054 | 7/1975 | Fed. Rep. of Germany . |
| 1323792 | 7/1973 | United Kingdom . |
| 1388144 | 3/1975 | United Kingdom . |
| 1440281 | 7/1976 | United Kingdom . |

*Primary Examiner*—George F. Lesmes
*Assistant Examiner*—E. Rollins Buffalow
*Attorney, Agent, or Firm*—James E. Bryan

[57] ABSTRACT

This invention relates to an improvement in a light-sensitive layer transfer material comprising a temporary film support and a light-sensitive thermoplastic photoresist layer detachably connected therewith, the improvement being that the underside of the film support has a lower adhesion to the photoresist layer than its upper side. The invention also relates to a process for transferring a light-sensitive photoresist layer from a temporary to a permanent support.

1 Claim, No Drawings

LIGHT-SENSITIVE LAYER TRANSFER MATERIAL

This is a continuation of application Ser. No. 972,817, filed Dec. 26, 1978 now abandoned.

The present invention relates to a light-sensitive layer transfer material comprising a temporary film support with a light-sensitive thermoplastic photoresist layer thereon, which is adapted for dry transfer to a permanent layer support.

A material of this type has been disclosed, e.g., in U.S. Pat. No. 3,469,982. It is especially suitable for the manufacture of materials from which printed circuits may be produced by etching or electroplating, for gravure printing forms, for chemical milling, and the like, and, if used for these purposes, has considerable advantages over the conventional application of a photoresist layer from a solution. For transfer of the layer, the surface of the light-sensitive layer—which is either bare or has been bared by peeling off a cover film that may be present—is laminated by means of heat and pressure onto a permanent support, and the temporary support, normally a transparent plastic film, is removed from the light-sensitive layer after exposure.

The above-mentioned cover film, which covers the surface of the photoresist layer away from the temporary film support, is necessary in all cases where the layer transfer material is to be wound into a roll for storage or transport. Because this is invariably the case in practice, a technical product which does not have such a cover film has not become known so far. If the unprotected surface of the photoresist layer were to come into direct contact with the back of the support film during winding up of the film, it would no longer be possible to detach the photoresist layer from the back of the support film in a controlled and safe manner.

THe use of a protective or cover film whose adhesion to the photoresist layer is less than that of the film support, also has some drawbacks, however.

It is a common feature of all known layer transfer materials and dry resist laminates, that polyolefin films, especially polyethylene films, are mentioned and used as particularly suitable cover films. Films made of these materials have the disadvantage that their dimensional stability, freedom from specks, and uniformity are not as good as those of the polyester films conventionally used as film supports and that they cannot be handled as easily and with as little fold-formation as polyester films. It is difficult to find a combination of films adapted to each other which has the required flexibility, transparency, optical and mechanical uniformity, ease of processing in a machine, etc., and which also has the different adhesion properties which are necessary to ensure that the resist layer does not adhere to the wrong film, particularly during delamination, and, on the other hand, keep it from adhering so strongly to the support that the laminated resist layer is pulled from the permanent support to be modified, when the temporary support is peeled off. Furthermore, the film support must be sufficiently flexible, and, at the same time, sufficiently rigid, to prevent the edges of the film from being lifted when the coated permanent support still covered by the film, e.g. a circuit board, is trimmed, thus avoiding defects in the resist layer. A further drawback, especially of polyethylene films, are irregularities which impress themselves into the resist layer during storage and which can amount to a serious defect, both from an aesthetic point of view and from the point of view of a possible application of the film.

It is the object of the present invention to provide a light-sensitive layer transfer material whose light-sensitive layer is protected from mechanical damage, e.g. scratches, and from dust and chemical influences until immediately before it is processed and which does not have the disadvantages associated with the use of commercial polyethylene cover films, such as the impression of irregularities (specks) of the film and the ensuing formation of holes in the light-sensitive layer.

In application Ser. No. 863,421, filed Dec. 22, 1977, it is suggested to solve this problem by using a photoresist double layer in which the two layers have different adhesions to the temporary film support. In this manner, the same material, e.g. polyester film, may be selected for the support film and the cover film.

The present invention is based on a light-sensitive layer transfer material which comprises a temporary film support and a light-sensitive thermoplastic photoresist layer detachably connected with the support. In the layer transfer material according to the present invention the underside of the film support has a lower adhesion to the photoresist layer than its upper side.

In this connection, the "upper side" of the film support is to be understood as the surface which remains attached to the photoresist layer after the material has been withdrawn from the roll.

In addition to the technical advantage that no impressions and holes can be formed in the light-sensitive layer by irregularities in the cover film, the omission of the cover film has the advantage that it saves cost and weight.

During processing of the wound-up material on a commercial laminator, the resist layer is separated from the less strongly adhering underside of the film support facing it. The further process steps are performed in the normal manner. It is apparent that any problems caused by the cover film in the case of materials comprising two films do not occur in the case of a material of the composition according to the invention.

In order to achieve a complete and reliable separation of the photoresist layer from the underside of the film support, which has the lower adhesion, when the roll is unwound, the adhesion of the two surfaces of the film to the resist layer should differ by at least 8 g/100 mm, preferably by 8 to 50 g/100 mm. On the other hand, the adhesion of the more strongly adhering film surface should not exceed 70 g/100 mm and preferably should be between 15 and 65 g/100 mm, in order to prevent the photoresist laye—which may be laminated to copper, e.g., and then exposed—from being detached from the copper surface when the temporary support is peeled off.

The above-mentioned difference in adhesion of the two surfaces of the film may be achieved, in known manner, by increasing the adhesion of the upper side of the support film, preferably a polyester film, e.g. by treatment with halogenated alkane carboxylic acids, such as trichloroacetic acid, or with halogenated phenols, or by precoating with suitable polymers, especially acrylate polymers, or by a corona treatment. Such treatments are disclosed, e.g. in the following printed publications: German Auslegeschrift No. 1,166,616, and German Offenlegungsschriften No. 2,403,054, No. 2,438,471, No. 2,335,465, No. 2,034,407, No. 2,528,807, No. 2,538,550, No. 1,797,348, No. 1,694,777, and No. 1,572,147.

Alternatively, a suitable adhesive layer may be produced, e.g., from a high molecular weight copolymer based on aromatic dicarboxylic acids and aliphatic diols with an average molecular weight between 1800 and 20,000, which is a known commercial product.

The increased adhesion has the further advantage that resist particles which may form when the circuit boards are trimmed, adhere to the film and do not interfere with the manufacturing process as statically charged stray particles.

Alternatively, an appropriate differentiation of the adhesive strength may be achieved by reducing the adhesion of the underside of the film support by treating one surface of the film with a slip or wetting agent, especially with anion-active or non-ionogenic wetting agents. The amides or esters of saturated or unsaturated higher molecular weight ($C_8$–$C_{20}$) fatty acids with amino or hydroxyalkane sulfonic acids or their alkali metal salts, e.g. $C_{18}H_{35}COOCH_2CH_2$—$SO_3Na$ or $C_{18}H_{35}CON(CH_3)CH_2CH_2SO_3Na$, may be used as anion-active wetting agents. This treatment simultaneously produces an anti-static effect and improves the wettability of the treated surface.

Other wetting agents which may be used are linear alkylaryl polyglycol ethers, e.g. nonyphenyl hexaethylene glycol ether, or mono castor oil acid triethanol amine ester, to which about 10 percent of a dispersing agent, e.g. of an ethylene oxide/fatty acid addition product, may be added, further diisobutenyl succinic acid polyglyceride or sodium diethoxy ethyl sulfosuccinate.

Any of the known support films normally used for this purpose may be used, e.g. those mentioned in U.S. Pat. No. 3,469,982, polyester films, especially biaxially stretched thermofixed polyethylene terephthalate films being preferred.

The photoresist layer may be either positive-working or negative-working. Suitable negative-working layers are disclosed in the above-mentioned U.S. patent, photopolymerizable layers comprising photopolymerizable compounds with at least two terminal vinyl or vinylidene groups, especially acrylic or methacrylic acid esters, in addition to polymeric binders, preferably aqueous-alkali soluble binders, and photoinitiators, being preferred. Suitable positive-working photoresist layers are disclosed, e.g. in U.S. Pat. No. 3,782,939, and in German Offenlegungsschrift No. 2,403,054.

In the following examples, the relationship between parts by weight and parts by volume corresponds to that between grams and milliliters. Unless otherwise stated, percentages and quantitative ratios refer to units by weight.

EXAMPLE 1

A 23 $\mu$m thick polyethylene terephthalate film was treated on one surface thereof with a 10 percent aqueous trichloroacetic acid solution and then dried at 135° C. The adhesion of the thus treated surface to the unexposed photoresist layer defined below was 62 g/100 mm, whereas the untreatd surface had an adhesion of about 20 g/100 mm. The treated surface was then coated with a coating of the following composition, the resulting dry layer having a thickness of 25 $\mu$m:

173 p.b.w. of a reaction product of 1 mole of 2,2,4-trimethylhexamethylene-diisocyanate and 2 moles of hydroxyethyl methacrylate,
200 p.b.w. of a terpolymer of n-hexyl-methacrylate, methacrylic acid, and styrene,
6.1 p.b.w. of 9-phenyl-acridine,
0.4 p.b.w. of Michler's ketone,
4.6 p.b.w. of triethyleneglycol dimethacrylate, and
1.0 p.b.w. of a blue azo dyestuff obtained by coupling 2,4-dinitro-6-chloro-benzene-diazonium salt with 2-methoxy-5-acetylamino-N-cyanoethyl-N-hydroxyethyl-aniline.

The thus coated film was dried at 135° C. and then wound into a roll.

The material can be wound off from the roll without difficulties in a commercial laminating apparatus, the photopolymer layer adhering reliably to the trichloroacetic acid-pretreated surface of the film.

EXAMPLE 2

A 23 $\mu$m thick polyethylene terephthalate film which had been treated on one surface thereof with a 4 percent aqueous solution of an anion-active wetting agent corresponding to the formula $C_{18}H_{35}COOCH_2CH_2SO_3Na$ to reduce its adhesion was provided on the untreated surface with a photopolymer layer of the composition defined in Example 1 dried at 135° C., and then wound up.

It will be obvious to those skilled in the art that many modifications may be made within the scope of the present invention without departing from the spirit thereof, and the invention includes all such modifications.

What is claimed is:

1. In a light-sensitive layer transfer material consisting essentially of a temporary film support and a negative-working light-sensitive thermoplastic photopolymerizable photoresist layer detachably connected therewith, the improvement that the adhesion of the upper side of the film support, which carries the light-sensitive layer, is increased with respect to that layer by treatment with an adhesive-promoting agent so that the adhesive difference between the upper side and the underside of the film support is at least 8 g/100 mm, and the adhesion of the upper side does not exceed 70 g/100 mm.

* * * * *

UNITED STATES PATENT AND TRADEMARK OFFICE
CERTIFICATE OF CORRECTION

PATENT NO. : 4,389,480
DATED : June 21, 1983
INVENTOR(S) : Werner Franke and Markus Seibel It is certified that error appears in the above—identified patent and that said Letters Patent is hereby corrected as shown below:

Column 2, line 51, "laye" should read - - - layer - - -;

Column 4, line 4, "untreatd" should read - - - untreated - - -;

Column 4, line 49, i.e., line 6 of Claim 1, after "which", the word - - - side - - - has been omitted.

Signed and Sealed this

Eleventh Day of October 1983

[SEAL]

Attest:

GERALD J. MOSSINGHOFF

Attesting Officer

Commissioner of Patents and Trademarks